(12) United States Patent
Abesingha

(10) Patent No.: US 11,005,460 B1
(45) Date of Patent: May 11, 2021

(54) FLYING LEVEL SHIFTER FOR NARROW PULSES

(71) Applicant: pSemi Corporation, San Diego, CA (US)

(72) Inventor: Buddhika Abesingha, Escondido, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/934,866

(22) Filed: Jul. 21, 2020

(51) Int. Cl.
*H03L 5/00* (2006.01)
*H03K 3/356* (2006.01)

(52) U.S. Cl.
CPC .............................. *H03K 3/356017* (2013.01)

(58) Field of Classification Search
CPC ............................................... H03K 3/356017
USPC ...................................... 327/333; 326/80.81
See application file for complete search history.

(56) References Cited

U.S. PATENT DOCUMENTS

| | | | | |
|---|---|---|---|---|
| 5,606,268 A * | 2/1997 | Van Brunt | ....... | H03K 19/00384 326/68 |
| 8,436,661 B2 * | 5/2013 | Lee | ................ | H03K 19/018564 327/108 |
| 8,547,138 B2 * | 10/2013 | Hatakeyama | ........ | G11C 7/1087 326/63 |
| 2003/0189443 A1 * | 10/2003 | Kunz | ............... | H03K 19/00315 326/81 |
| 2003/0227313 A1 * | 12/2003 | Randazzo | ............... | G05F 3/242 327/333 |
| 2009/0080570 A1 * | 3/2009 | Bilash Dubey | | ............................ H03K 19/018528 375/319 |
| 2019/0068194 A1 * | 2/2019 | Alessandro | ............ | H03K 3/012 |

* cited by examiner

*Primary Examiner* — Ryan Jager
(74) *Attorney, Agent, or Firm* — Steinfl + Bruno LLP

(57) ABSTRACT

Systems, methods, and devices for generation of narrow pulses in a flying high-voltage domain that are used as a timing control signal are presented. A main signal processing path that generates the timing control signal is replicated and used to detect time and duration of perturbations due to flying events in the main signal processing path based on a fixed input level to the replicated path. Detected time and duration of the perturbations are used to generate a blanking control signal to the main signal processing path. According to one aspect, the main signal processing path may be part of a high side level shifter that operates in a flying high-voltage domain and used to control a high-voltage switching device.

20 Claims, 11 Drawing Sheets

FLYING LEVEL SHIFTER FOR NARROW PULSES

TECHNICAL FIELD

Various embodiments described herein relate generally to systems, methods, and devices for generation of narrow pulses in a flying high-voltage domain, including level shifting of timing control signals having narrow pulses from a low-voltage domain to the flying high-voltage domain while protecting the level shifted control signal against transient effects due to flying events. Exemplary applications may include level shifters to control gate voltages of high-voltage transistors in switch-mode (switching) power converters.

BACKGROUND

Switch-mode power converters may include two or more power devices that are controlled for alternating ON/OFF states to provide current to a load. A prior art exemplary embodiment of a switch-mode (switching) power converter (100A) is shown in FIG. 1A, wherein a stack of high-voltage transistors (T1, T2) coupled between a high voltage supply, $V_{IN}$, and a reference ground, GND, is controlled to provide a current to an inductor L1, which in turn provides an output DC voltage $V_{OUT}$ based on a low pass filter formed by the inductor L1 and a shunted capacitor C1. ON and OFF states of the high side transistor, T2, and the low side transistor, T1, are controlled via respective high side control circuit (110) comprising a level shifter (110a) and a driver (110b), and low side control circuit (120) comprising a level shifter (120a) and a driver (120b). Timing control generated by an input & timing control circuit (105) based on an input signal PWM to the power converter (100A) is used by the high side and low side control circuits (110, 120) to generate gate voltages $VG_1$ and $VG_2$ and thereby control the ON and OFF states of the transistors T1 and T2. As can be seen in FIG. 1A, the input & timing control circuit (105) may operate between a supply voltage $V_{DD1}$ (e.g., low voltage, such as about 0 to 3.5-5 V)) and a reference ground, GND.

Because of the ON and OFF switching of the high-voltage transistors T1 and T2, a voltage at a common node, SW, of such transistors switches between the high voltage, $V_{IN}$, and the reference ground, GND. Since the node SW also defines the source node of the high side transistor, T2, it follows that the gate voltage $VG_2$ of the high side transistor "rides" the switching voltage at the common node, SW. Accordingly, as it is well known in the art, the high side control circuit (110) may operate in a "flying" high voltage domain (SW+$V_{DD2}$, SW), or in other words, a voltage domain wherein the reference voltage is the switching voltage at the common node, SW. This is shown in FIG. 1A as the high side control circuit (110) operating between a supply voltage SW+$V_{DD2}$ ($V_{DD2}$ being a low voltage, may be same as or different from $V_{DD1}$) and the switching voltage at the node SW (used as the flying/switching reference voltage). On the other hand, the low side control circuit (120) may operate between the supply voltage $V_{DD2}$ and the reference ground, GND.

FIG. 1B shows details of an exemplary block diagram of the high side level shifter (110a) of FIG. 1A used for processing of a high side input timing control signal, HX, to generate an output timing control signal, HS, to be provided to the driver circuit (110b) of FIG. 1A for generation of the gate voltage $VG_2$. Also shown in FIG. 1B is generation of the high side input timing control signal, HX, by the input & timing control circuit block (105) based on the input timing control signal, PWM. A person skilled in the art is well aware of different implementations for generating the signal HX, including by way of a single pulse signal that includes the complete timing control information (e.g., falling and rising edges) or by way of complementary pulse signals each including partial (e.g., one edge) timing control information. According to some exemplary implementations, generation of the complementary pulse signal may be provided within the high side level shifter (110a) instead of the circuit block (105). Accordingly, circuit blocks that implement a main signal processing path that generates the high side output timing control signal, HS, from the input timing control signal, PWM, is shown in FIG. 1B.

As can be seen in FIG. 1B, the high side level shifter (110a) may include an input signal translator circuit block (110a1) that is configured to translate timing information contained in the signal HX to a level shifted signal to be fed to the input latch & processing circuit block (110a2). Such timing information within the signal HX may be provided via a combination of a voltage level and/or edge positions of the signal HX, which information is extracted and level shifted from the low-voltage domain ($V_{DD1}$, GND) to the flying high-voltage domain (SW+$V_{DD2}$, SW) by the circuit block (110a1). The level shifted signal output by the circuit block (110a1) may be processed by the circuit block (110a2) which may include an input latch and other processing circuits, including for example, delay circuits that may be used to equalize propagation delay between the high side and the low side control circuits (110, 120). The output of the circuit block (110a2) is fed to the logic circuit block (110a3) which may, for example, be used to implement filtering of timing information provided to the output latch circuit block (110a4). For example, as described below, the filtering implemented within the circuit block (110a3) may include blanking which can filter out (remove, conceal, blank out, mask) any transition that is within a predetermined fixed period of time after one transition fed to and processed by the output latch circuit block (110a4) and output at the output timing control signal, HS.

As it is well known in the art, the switching voltage at the node SW (e.g., FIG. 1A) can switch from the reference ground, GND, to the high voltage, $V_{IN}$, in very short times (e.g., 100 volts or more per nanosecond) and therefore create flying events in the high side control circuit (110) having fast voltage variations with respect to time (i.e., dV/dt). In turn, such flying events can corrupt timing information being processed by the high side control circuit (110), in particular by the high side level shifter (110a) shown in FIG. 1A and FIG. 1B. Accordingly, as described above, prior art level shifters operating over a flying high-voltage domain (e.g., SW+$V_{DD2}$, SW) may implement a blanking feature to protect/immunize the timing information processed, as shown, for example, in FIG. 1C.

FIG. 1C shows a blanking according to the prior art as applied to an output control signal, HS, of the high side level shifter (110a). As shown by signal flow details a and b of FIG. 1C, it is assumed that a rising edge, $T_R$, of the output control signal, HS, causes a rising edge of the switching reference voltage, SW, and a falling edge, $T_F$, of the output control signal, HS, causes a falling edge of the switching reference voltage, SW.

As can be seen in FIG. 1C, the blanking according to the prior art includes a (fixed) blanking time period, $T_{BLK}$, that is introduced after processing of a timing information (e.g., a rising edge $T_R$ of an output HS) by the high side level shifter (110a), such as for example by the output latch (110a4) of FIG. 1B, to indicate a time period before which a next timing information (e.g., a falling edge $T_F$) can be processed by said level shifter. In other words, the blanking according to the prior art masks any timing information from being processed by the high side level shifter (110a) during the (fixed) blanking time period $T_{BLK}$, starting immediately after processing of one timing information. Such blanking according to the prior art provides the advantage of protecting corruption of timing information carried by (contained within) the output control signal HS of the high side level shifter (110a) due to flying events, at the cost of providing a built-in minimum pulse width of the output control signal HS that is larger than the blanking time period, $T_{BLK}$. Typical values of the blanking time period, $T_{BLK}$, are in a range between 10 nanoseconds to 20 nanoseconds and are chosen to be long enough for the high side level shifter (110a) to safely ride through the flying events without any corruption in corresponding timing information.

While blanking according to the prior art allows a level shifter operating over a flying high-voltage domain to robustly operate during flying events, it prevents the level shifter from processing timing information represented by narrow pulses (e.g., as provided by the input PWM signal of FIG. 1A and FIG. 1B) that are shorter than the fixed blanking time period (e.g., $T_{BLK}$ of FIG. 1C). However, such narrow pulses may be desirable not only in switch-mode power converter solutions to provide finer and wider range of DC output control via higher ON/OFF duty cycles, but also in small footprint and low-profile switch-mode power converter solutions that need to operate at high frequencies to keep external passive component size small, as well as to generally provide switch-mode power converter solutions having finer and wider range of DC output control via higher ON/OFF duty cycles.

An element of the current invention is the inventor's recognition that within circuits as discussed herein, internal latch nodes may exist within high side level shifters that may be destabilized during so-called flying events (described below, and as a person of ordinary skill will understand) by parasitic inductive and capacitive charging and discharging mechanisms (also described below). We use the term "latch node" to be such a node that may be found within the main signal path or may be found within embodiments of the current invention comprising exemplary, inventive circuitry that resolves or eliminates the deleterious/destabilizing effects. As a person of ordinary skill will understand, these latch nodes may perform other functions than their latching function, including, but not limited to, nodes of digital logic gates that are designed to change state based on transition information from another logic gate and/or from an input signal, and that this description is intended to clarify the invention and is not intended to limit the scope or applicability of the invention.

Based on the above, it follows that there is a need for a level shifter operating over a flying high-voltage domain capable of processing timing information represented by narrow pulses having a duration that is, for example, shorter than 10 nanoseconds, and even shorter than 5 nanoseconds. Teachings according to the present disclosure present such level shifter.

SUMMARY

According to a first aspect of the present disclosure, a circuit for generation of an output timing control signal in a flying high-voltage domain is presented, the circuit comprising: a main signal processing path configured to receive an input timing control signal in a low-voltage domain and generate therefrom the output timing control signal in the flying high-voltage domain; and a flying event detector circuit comprising a replica signal processing path that is a replica of the main signal processing path, the flying event detector circuit configured to detect time and duration of perturbations caused by flying events in the replica signal processing path and generate therefrom a blanking control signal to the main signal processing path.

According to a second aspect of the present disclosure, a method for generation of shorter pulse widths of an output timing control signal in a flying high-voltage domain is presented, the method comprising: providing a main signal processing path configured to receive an input timing control signal in a low-voltage domain and generate therefrom the output timing control signal in the flying high-voltage domain; replicating the main signal processing path, thereby providing a replica signal processing path, detecting time and duration of perturbations caused by flying events in the replica signal processing path; and based on the providing, replicating and detecting, generating a blanking control signal to the main signal processing path.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

The present disclosure describes systems, methods, and devices for generation of narrow pulses in a flying high-voltage domain, including level shifting of timing control signals having narrow pulses from a low-voltage domain (e.g., $V_{DD1}$, GND) to the flying high-voltage domain (e.g., SW+$V_{DD2}$, SW) while protecting the level shifted control signal against transient effects due to flying events.

Figure 1A:
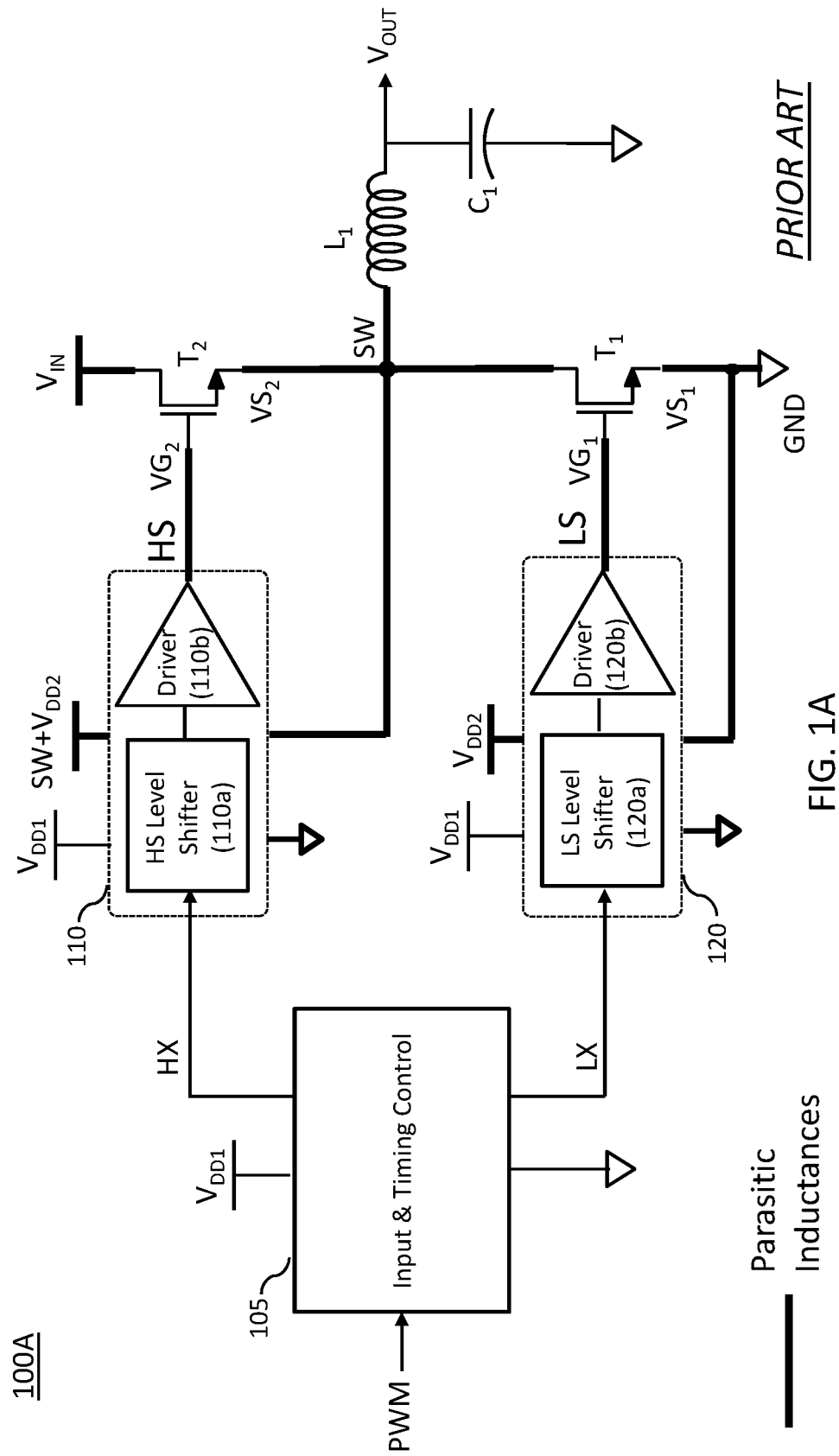
FIG. 1A shows a block diagram of a prior art switch-mode power converter including series connected high side and low side transistors respectively controlled by a high side control circuit and a low side control circuit.

An exemplary application may include a high side level shifter to control the gate voltage of a high-voltage transistor in a switch-mode (switching) power converter, such as, for example, the high side transistor T2 shown in FIG. 1A. The high side level shifter according to the present disclosure can replace the high side level shifter (110a) of FIG. 1A to process input timing control signals (PWM) and generate therefrom output timing control signals having narrow pulses with durations that are shorter, for example, than 10 nanoseconds and even shorter than 5 nanoseconds.

Such timing control signals with short durations are made possible by foregoing the prior art fixed length blanking time period (e.g., $T_{BLK}$ of FIG. 1C) used for protection against flying events in favor of an event based blanking time period that essentially corresponds to the length of a flying event as detected in real-time. Accordingly, as a duration of a flying event may be in the order of 1 nanosecond to 2 nanoseconds, considerable reduction in a blanking time according to the present disclosure is provided when compared to the prior art implementation.

Detection of a flying event according to the present disclosure is provided by mimicking latch nodes in a main signal processing path (e.g., circuit blocks 110a1, 110a2 of FIG. 1B) of the level shifter according to the present disclosure and subject such mimicked latch nodes to same switching events present in the main signal processing path. As the mimicked latch nodes react to the switching events to generate transient signals corresponding in time and duration to the switching events, generated transient signals are used to (actively) control blanking of the main signal processing path instead of relying on fixed blanking as in the prior art cited above.

Teachings according to the present disclosure implement such mimicking of the latch nodes by duplicating/replicating a portion of the main signal processing path, or the entirety of the main signal processing path, to generate a replica signal processing path. By operating the replica signal processing path over the same voltage domains (e.g., (SW+$V_{DD2}$, SW) and/or ($V_{DD1}$, GND)) as the main signal processing path, same switching events at corresponding latch nodes will be present in both paths. A person skilled in the art will appreciate that monolithic integration and known in the art circuit layout techniques can allow high fidelity reproduction of the replica signal processing path according to the main signal processing path, including all of the latch nodes.

According to an embodiment of the present disclosure, the input to the replica circuit may be a fixed voltage (e.g., tied to GND or any other fixed voltage level) so that voltages at the latch nodes of the replica circuit only reflect charging and discharging of the latch nodes based on the flying event and not further based on changing levels of an input signal being processed (as per the main signal processing path). This may allow for an increased in detection accuracy in time and duration of the flying events.

In some embodiments according to the present disclosure, time and/or duration of the detected flying event may be equalized/adjusted by back-end logic of a flying event detector circuit to avoid race conditions between the main signal processing path and the replica signal processing path, thereby allowing proper blanking of transients in the main signal processing path. In other words, one or more of a rising and a falling edge of a detected flying event may be adjusted in time to ensure that a corresponding blanking control signal to the main signal processing path effectively blanks out transients in the main signal processing path due to a dual flying event of the detected flying event. According to some exemplary embodiment according to the present disclosure, such equalization may be provided by a combination of controlled/designed propagation delays in both the replica signal processing path (e.g., back-end logic block 350b of FIG. 3C later described) and the main signal processing path (e.g., logic circuit block 110a3 of FIG. 1B).

Figure 1B:
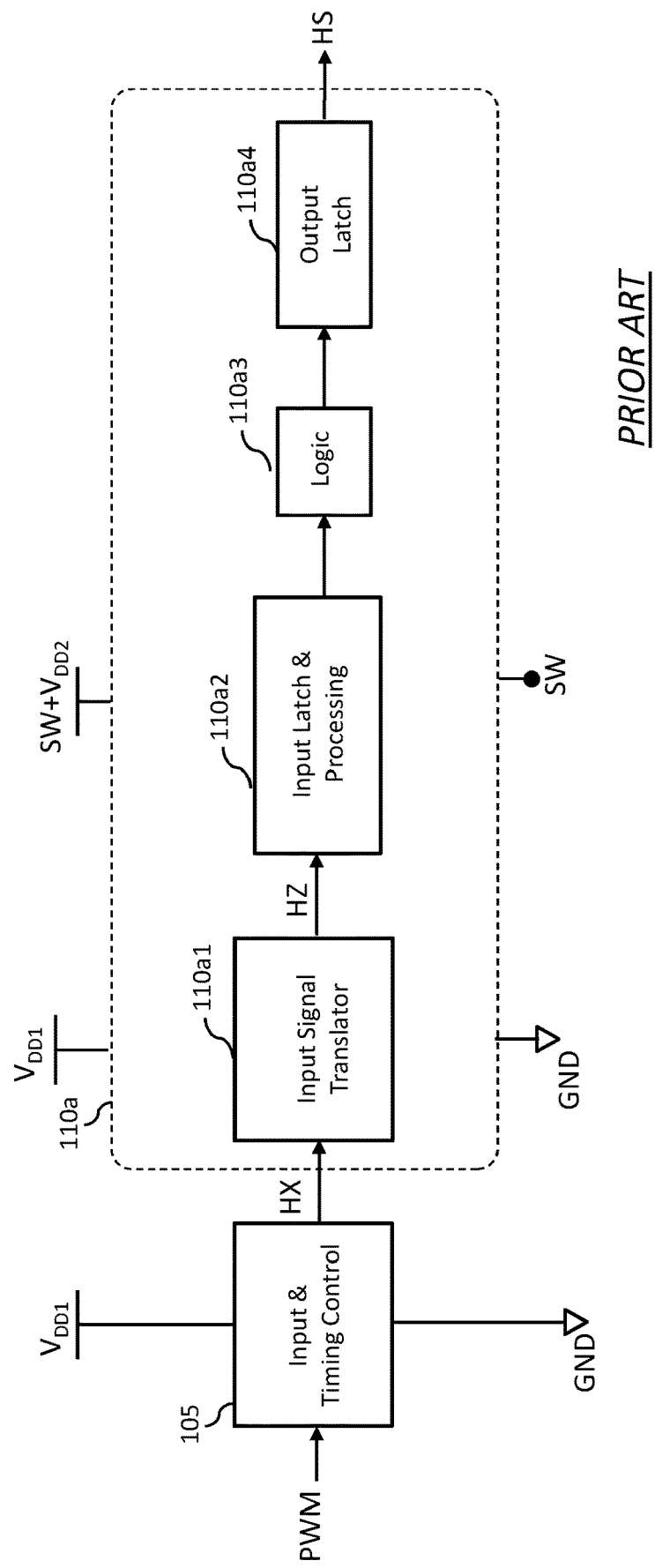
FIG. 1B shows details of a block diagram of the high side level shifter of FIG. 1A used for processing of an input timing control signal to generate an output timing control signal.
Figure 1C:
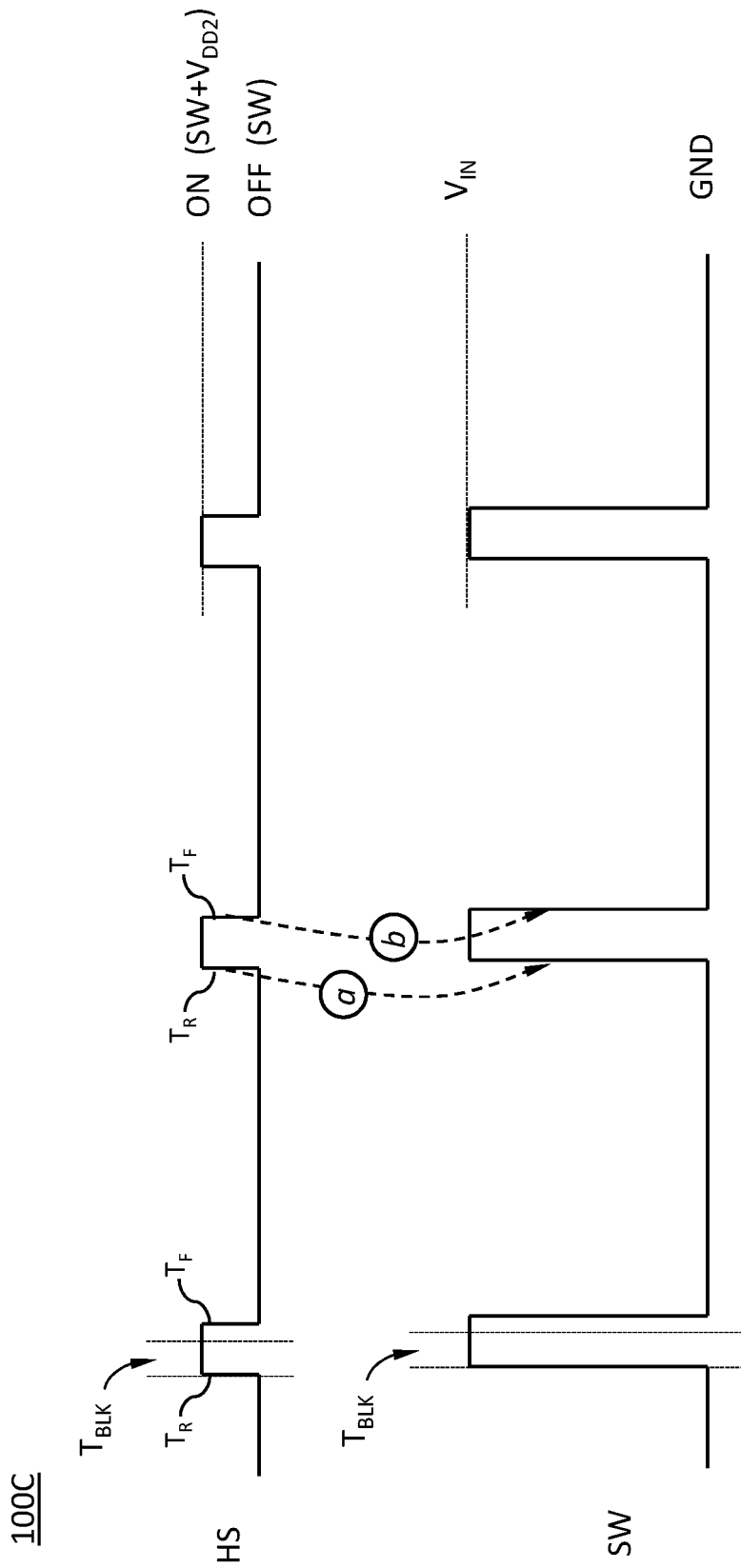
FIG. 1C shows a timing diagram representative of a prior art blanking time period applied on a high side level shifter of the high side control circuit of FIG. 1A or FIG. 1B.
Figure 2A:
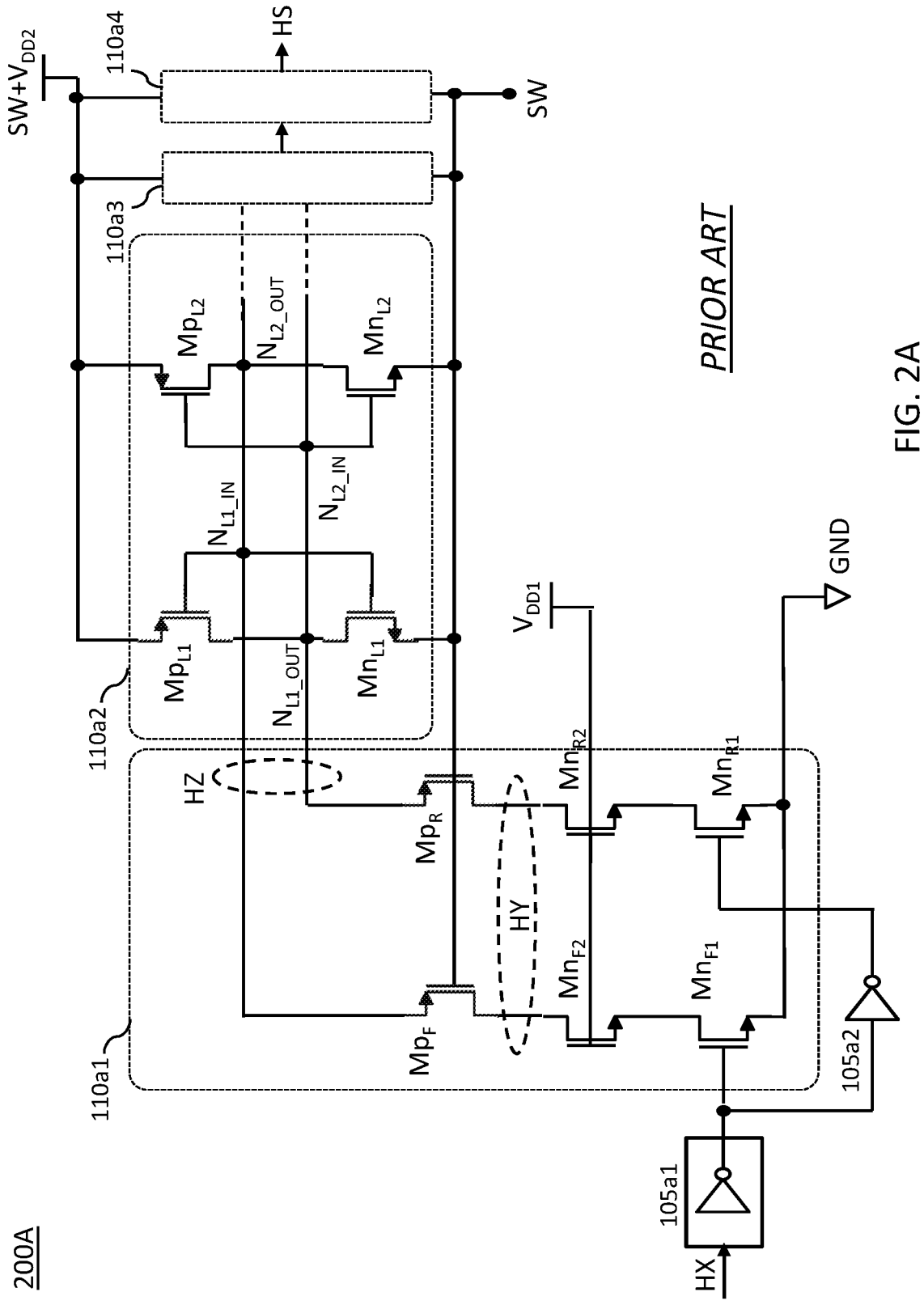
FIG. 2A shows exemplary circuit details used to implement blocks shown in FIG. 1B.

FIG. 2A shows exemplary circuits details used to implement blocks (e.g., 110a1, 110a2) of the main signal processing path shown in FIG. 1B. Such exemplary circuits are discussed herein with the aim of highlighting exemplary latch nodes replicated in the replica signal processing path for detection of the flying events according to the present teachings. As described above, the replica signal processing path according to the present disclosure replicates one or more of the blocks shown in FIG. 2A, including the latch nodes present in such blocks. It should be noted that such circuits are purely exemplary in nature and therefore should not be considered as limiting the scope of the present teachings, as such teachings may equally apply to any specific circuit used in a main signal processing path used for generation of the high side output timing control signal HS, such circuits including latch nodes that react to the flying events to generate therefrom transient signals that may corrupt the control timing information output by the high side control circuit (e.g., 110 of FIG. 1A). Furthermore, it should be noted that the present teachings may equally apply to circuits that are implemented in any of known technologies for manufacturing and monolithic integration, including known in the art bulk-silicon and non bulk-silicon technologies or combination thereof (e.g., BCD technology). In general, individual devices/transistors in the main processing path can include one or more of CMOS, DMOS and/or bipolar transistors.

With Further reference to FIG. 2A, the main signal processing path according to the present disclosure may include the circuit block (110a1) used for translating levels of the signal HX from the low-voltage domain ($V_{DD1}$, GND) to the flying high-voltage domain (SW+$V_{DD2}$, SW) via high-voltage stand-off PMOS transistors $Mp_F$ and $Mp_R$. As described above, the circuit block (110a1) may not only translate voltage levels between the two voltage domains, but also reproduce control timing information contained within the input signal HX. In the exemplary case shown in FIG. 2A, such timing information is split between the two complementary signals HY coupled to the drains of the high-voltage stand-off PMOS transistors $Mp_F$ (e.g., for falling edge information) and $Mp_R$ (for rising edge information). In turn the circuit block (110a1) may output level adjusted timing information for further processing by the circuit block (110a2). The main signal processing path according to the present disclosure may receive, as its input to the circuit block (110a1), the high side input timing control signal, HX. The circuit block (110a1) contains internal signal, HY, as shown in FIG. 2A, and the output of circuit block (110a1), passed by high voltage standoff transistors $Mp_F$ and $Mp_R$, serves as input signal, HZ, to the circuit block (110a2).

With continued reference to FIG. 2A, the main signal processing path according to the present disclosure may include the circuit block (110a2) used to latch the level shifted input signal HY and then output by the circuit block (110a1) (whose output HZ serves as an input signal to circuit block 110a2) via the input latch comprising transistors $Mp_{L1}$, $Mn_{L1}$ $Mp_{L2}$, and $Mn_{L2}$, and generate therefrom, output control signal for further processing by the blocks (110a3) and (110a4). As shown in FIG. 2A, a first inverter ($Mp_{L1}$, $Mn_{L1}$) of circuit block 110a2 takes input HZ at node $N_{L1\_IN}$ coupled to the source of the high-voltage stand-off transistor $Mp_F$ to output therefrom a signal at an output node $N_{L1\_OUT}$ of the first inverter comprising transistors $Mn_{L1}$ and $Mp_{L1}$. Likewise, a second input latch ($Mp_{L2}$, $Mn_{L2}$) takes input HZ at node $N_{L2\_IN}$ coupled to the source of the high-voltage stand-off transistor $Mp_R$ to output therefrom a signal at an output node $N_{L2\_OUT}$ of the second inverter comprising transistors $Mn_{L2}$ and $Mp_{L2}$. Furthermore, as can be seen in FIG. 2A, the output node $N_{L1\_OUT}$ of the first inverter is coupled/tied to the input node $N_{L2\_IN}$ of the second inverter, and the output node $N_{L2\_OUT}$ of the second inverter is coupled/tied to the input node $N_{L1\_IN}$ of the first inverter, thereby creating a latching mechanism for the output $N_{L1\_OUT}$ and $N_{L2\_OUT}$. In particular, as shown in the following figures, latch nodes $N_{L1\_OUT}$ and $N_{L2\_OUT}$ may react to flying events by charging and discharging, and therefore affect/corrupt timing control signals output by the circuit block (110a2) for further processing by the circuit blocks (110a3) and (110a4).

Figure 2B:
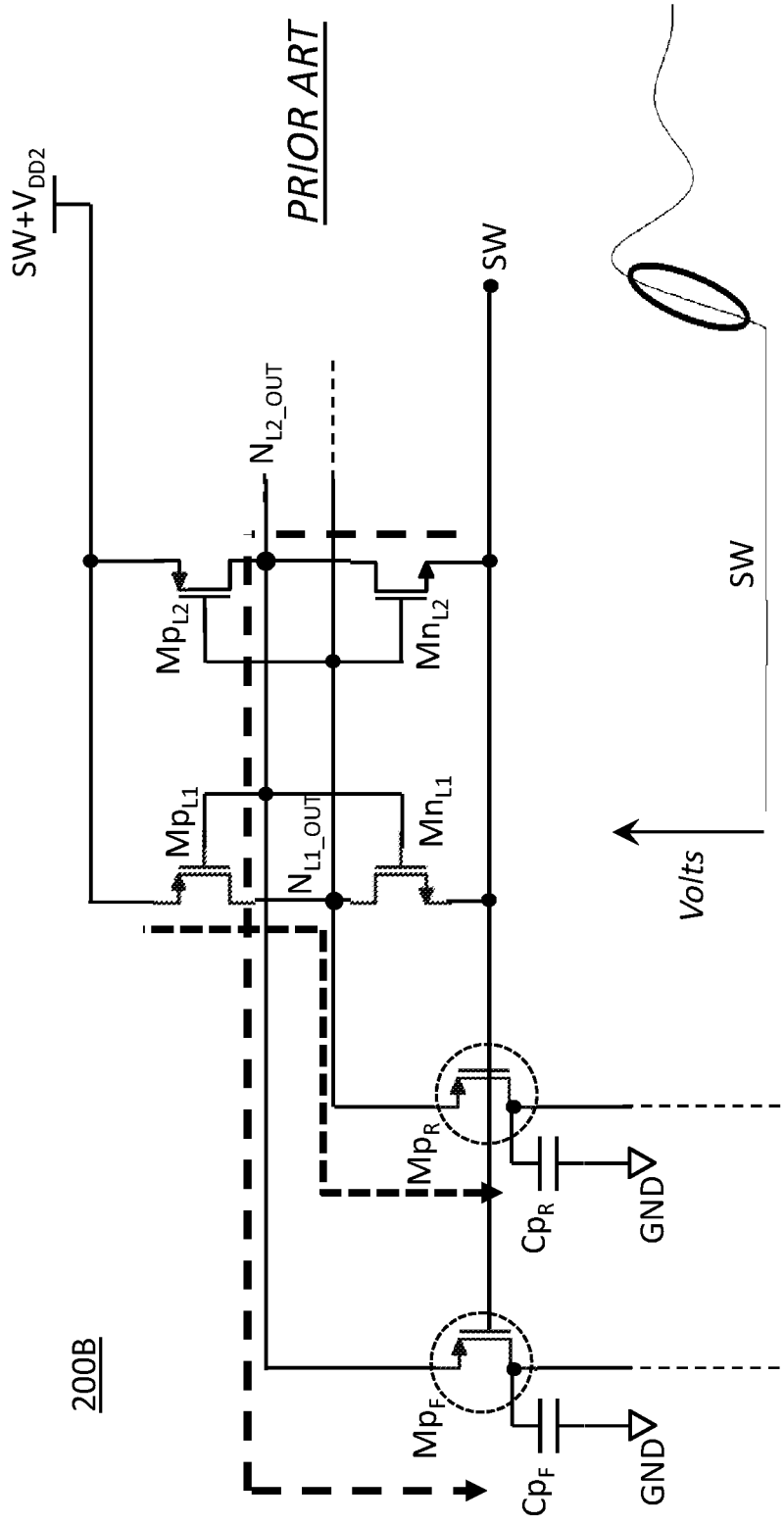
FIG. 2B shows discharging of latch nodes of the exemplary circuit of FIG. 2A responsive to a rising edge of a flying event.
Figure 2C:
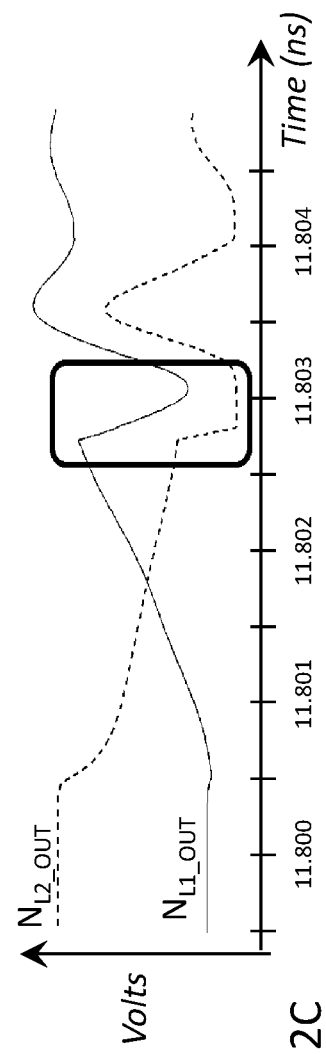
FIG. 2C shows exemplary graphs representative of the discharging of the latch nodes shown in FIG. 2B.

FIG. 2B shows, as thicker dashed lines, discharging paths of the parasitic inductance paths shown as thicker lines in FIG. 1A responsive to a flying event due to a rising edge of the switching reference voltage shown in FIG. 2C. As it is well understood by a person skilled in the art, the switching nature of the voltage at the node SW coupled with parasitic inductive elements (as shown by the bold lines in FIG. 1A) present in the circuit shown in FIG. 1A can introduce ringing effects, including overshoots and undershoots, at the transitions of the voltage at the node SW as shown in FIG. 2C. In particular, as highlighted in FIG. 2C, an overshoot corresponding to a rising edge of the switching reference voltage SW can be 50% or more above a steady-state high value of the voltage SW. Also, as can be seen in FIG. 2C, such rising edge may be responsive to a rising edge of a voltage at the $N_{L1\_OUT}$ node and a falling edge of a voltage at the $N_{L2\_OUT}$ node.

As it is well understood by a person skilled in the art, each of the high-voltage stand-off transistors $Mp_F$ and $Mp_R$ may include a corresponding parasitic capacitance to ground $Cp_F$ and $Cp_R$ shown in FIG. 2B, that inherently follows levels of the switching reference voltage SW coupled to the stand-off transistors $Mp_F$ and $Mp_R$. As shown in FIG. 2B, charging paths for charging of the parasitic capacitances $Cp_F$ and $Cp_R$ pass through the latch nodes $N_{L1\_OUT}$ and $N_{L2\_OUT}$. Therefore, charging of the parasitic capacitances $Cp_F$ and $Cp_R$ may discharge respective latch nodes $N_{L2\_OUT}$ and $N_{L1\_OUT}$ to effectively reduce voltage levels at such latch nodes as shown in FIG. 2C. In particular, as shown in FIG. 2C, during a positive transition (i.e., rising edge) of the switching reference voltage, SW, from a low voltage level to a high voltage level in view of the ringing of the switching reference voltage, the output node $N_{L1\_OUT}$ may discharge due to charge transfer from $N_{L1\_OUT}$ to charge $Cp_R$, and $Mp_{L1}$ which is ON, not being able to replenish the lost charge in a sufficient time to hold the $N_{L1\_OUT}$ at the intended voltage. Similarly output node $N_{L2\_OUT}$ may discharge due to charge transfer from $N_{L2\_OUT}$ to charge up $Cp_F$, and $Mn_{L2}$ which is ON, not being able to replenish the lost charge in a sufficient time such that $N_{L2\_OUT}$ discharges below the SW reference to turn-on $Mn_{L2}$'s parasitic body diode (not shown).

Figure 2D:
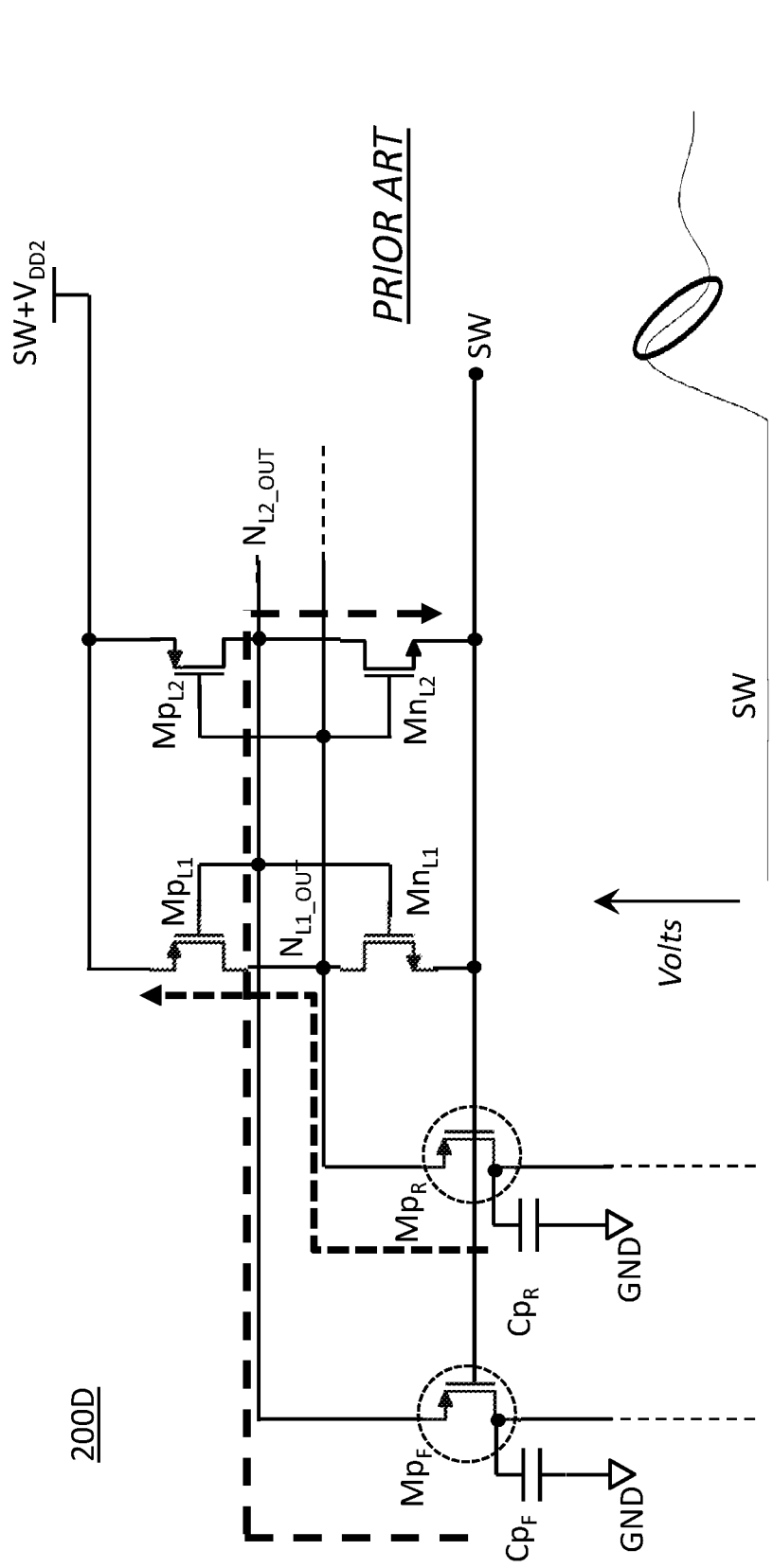
FIG. 2D shows charging of latch nodes of the exemplary circuit of FIG. 2A responsive to a falling edge of a flying event.
Figure 2E:
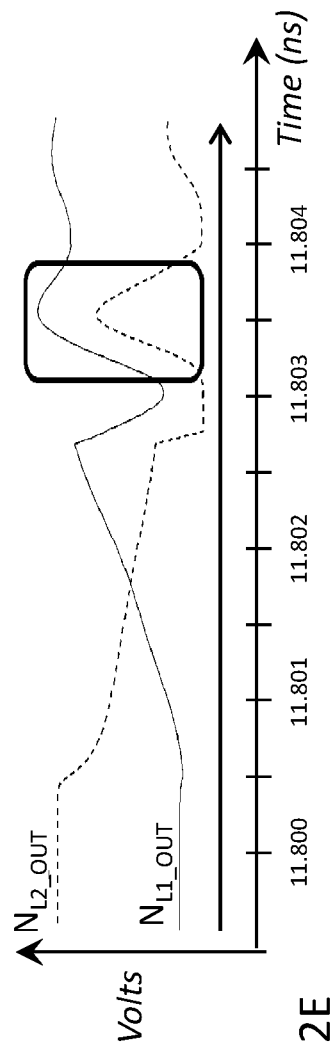
FIG. 2E shows exemplary graphs representative of the charging of the latch nodes shown in FIG. 2D.

As shown in FIG. 2D, discharging paths for discharging of the parasitic capacitances $Cp_F$ and $Cp_R$ also pass through the latch nodes $N_{L1\_OUT}$ and $N_{L2\_OUT}$. Therefore, discharging of the parasitic capacitances $Cp_F$ and $Cp_R$ may charge respective latch nodes $N_{L2\_OUT}$ and $N_{L1\_OUT}$ to effectively increase voltage levels at such latch nodes as shown in FIG. 2E. In particular, as shown in FIG. 2E, during a negative transition (i.e., falling edge) of the switching reference voltage, SW, from a high voltage level to a low voltage level in view of the ringing of the switching reference voltage, the output node $N_{L1\_OUT}$ may charge up due to transfer of charge from $Cp_R$ in to $N_{L1\_OUT}$ and $Mp_{L1}$, which is ON, not being able to remove the charge in a sufficient time such that $N_{L1\_OUT}$ charges above Vdd2+SW to turn on MpL1's parasitic body diode (not shown). Similarly the output node $N_{L2\_OUT}$ may charge up due to transfer of charge from $Cp_F$ into $N_{L2\_OUT}$ and MnL2, which is ON, not being able to remove the additional charge in sufficient time to hold $N_{L2\_OUT}$ at the intended voltage.

Figure 3A:
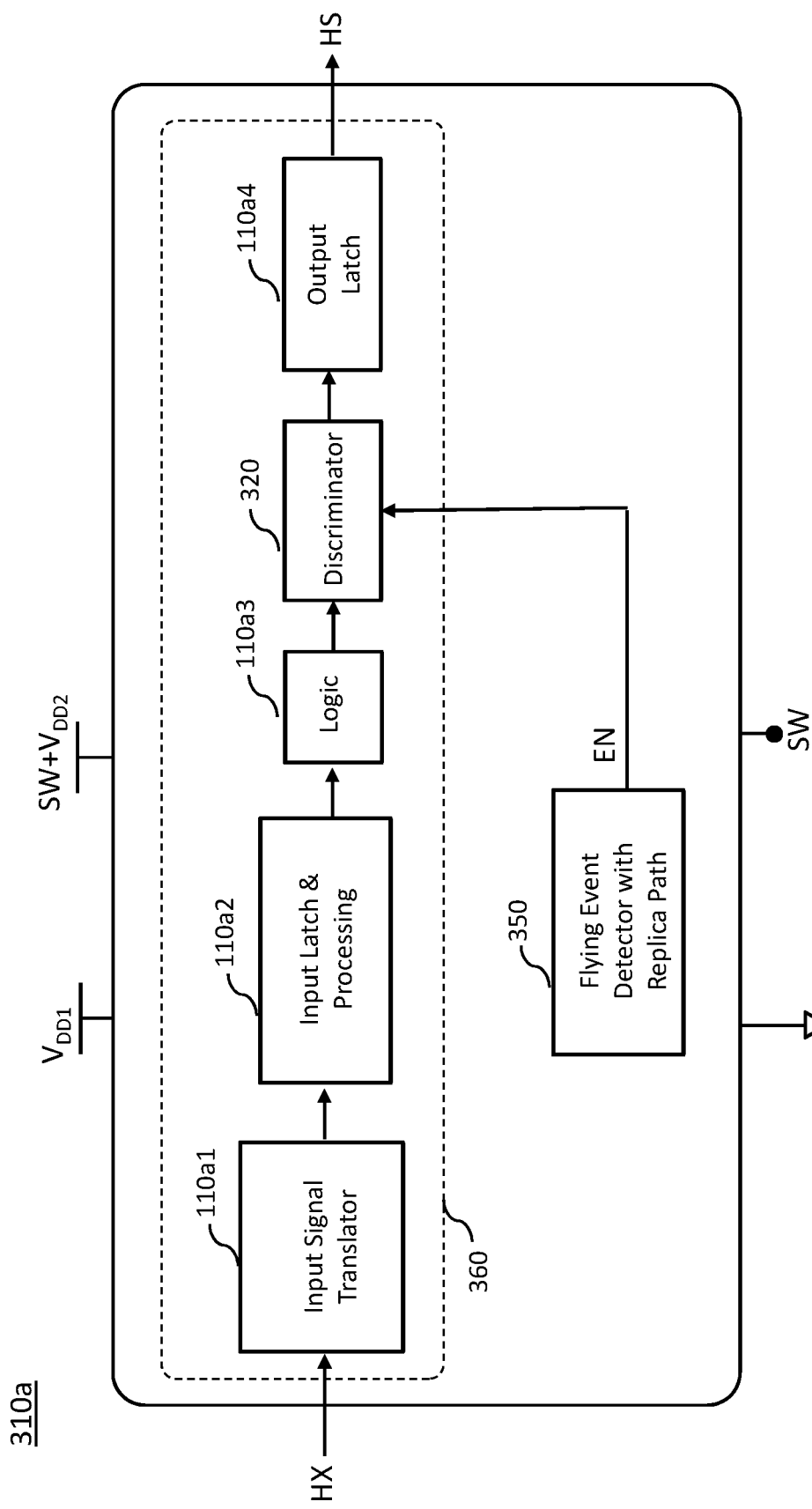
FIG. 3A shows a block diagram of a high side level shifter according to the present disclosure that includes a flying event detector that controls operation of a main signal processing path.

FIG. 3A shows a block diagram of a high side level shifter (310a) according to the present disclosure that includes a flying event detector circuit block (350) that controls operation of a main signal processing path (360) of the high side level shifter (310a). As can be seen in FIG. 3A, the main signal processing path (360) may include circuit blocks (110a1), (110a2), (110a3) and (110a4) that are common to the prior art configuration described above. Furthermore, the main signal processing path (360) may include a discriminator circuit block (320) that is arranged between an output of the logic circuit block (110a3) and an input of the output latch circuit block (110a4), configured to discriminate, under control of an enabling signal, EN, generated by the flying event detector circuit block (350), between transitions provided by the high side input timing control signal, HX, and transitions (e.g., transients) generated by effects of the flying events detected by the circuit block (350) upon latch nodes as exemplified above with reference to FIGS. 2A-2E. In other words, the discriminator circuit block (320) may insert an event based blanking time period that essentially corresponds to the length of a flying event as detected in real-time by the flying event detector circuit block (350).

Figure 4:
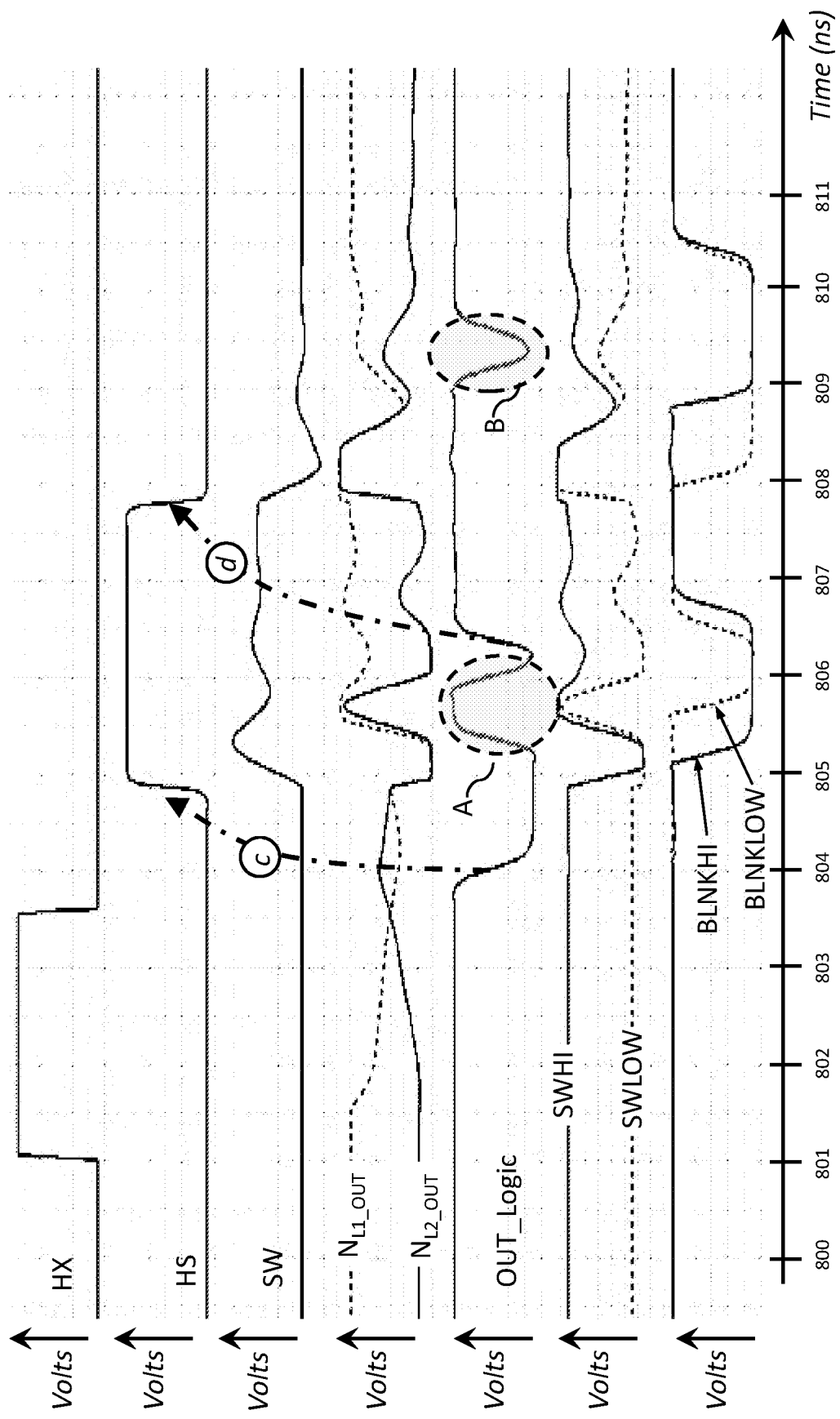
FIG. 4 shows a timing diagram representative signals through the main processing path of the high side level shifter of FIG. 3A and FIG. 3B.

It should be noted that although the discriminator circuit block (320) is shown in FIG. 3A as a separate block from the logic circuit block (110a3), implementations may vary, such as, for example, merging the two circuit blocks (110a3) and (320) as one circuit block. Timing diagram representative of signals through the main signal processing path (360) are shown in FIG. 4 which are later described. It should be noted that the enabling signal, EN, output by the flying event detector circuit block (350) may include one or more control signals to the circuit block (320), including two signals as shown in the exemplary timing diagram of FIG. 4 later described.

Figure 3B:
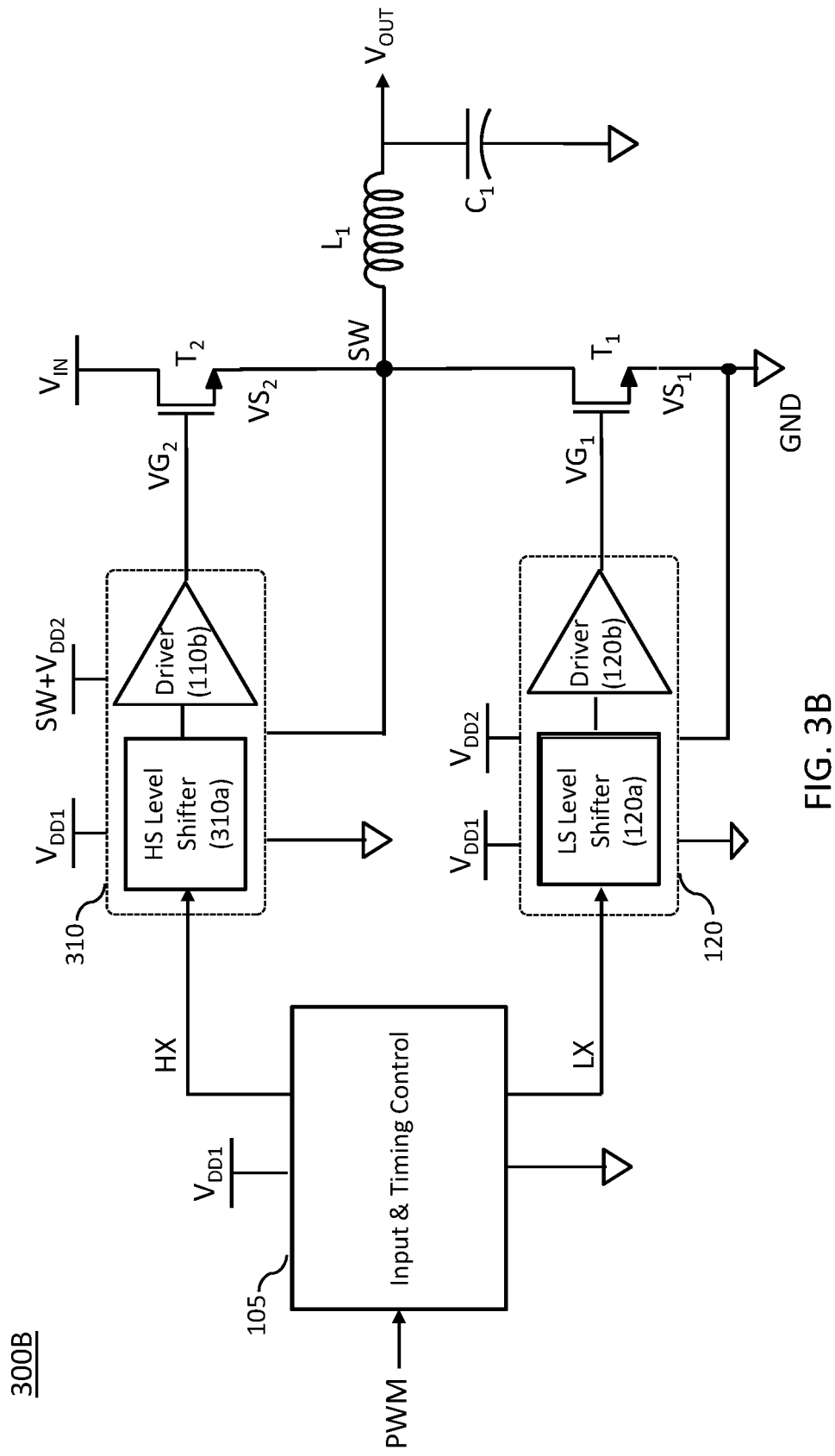
FIG. 3B shows a block diagram of a switch-mode power converter according to the present disclosure including the high side level shifter of FIG. 3A.

FIG. 3B shows a block diagram of a switch-mode power converter, also called a DC-DC converter or high-voltage DC-DC converter, (300B) according to an exemplary embodiment of the present disclosure including the high side level shifter (310a) of FIG. 3A. As can be clearly understood by a person skilled in the art, such switch-mode power converter comprising exemplary high side level shifter 310a is based on the prior art power converter described above with reference to FIG. 1A, wherein the prior art high side level shifter (110a) is replaced with the exemplary, inventive level shifter (310a). In other words, teachings according to the present disclosure may allow any known in the art switch-mode power converter to operate at shorter output pulse widths (e.g., 5-10 nanoseconds and shorter, as discussed below) by simply replacing its high side level shifter with the level shifter according to the present disclosure, including a flying event detector circuit having a signal processing path that is a replica of a main signal processing path used to generate corresponding output timing information (e.g., signal HS).

The flying event detector (350) in conjunction with the discriminator (320) work to allow very narrow pulse widths (e.g. 5-10 nanoseconds and shorter) to pass through the level shifter (310a), while providing immunity to flying events that could corrupt the signals in the main path. Known in the art level shifters may include a built-in fixed time period during which the level shifter is prevented from transitioning again once a transition has already occurred. Such fixed time period is referred to as the blanking period, and is designed to be long enough in order to provide immunity to the flying event. Typically blanking periods are greater than 10 nanoseconds and more typically in the 30-50 nanoseconds range to allow the level shifter to transition through the flying event before it can respond to the input signal. The blanking period limits the minimum pulse widths that the level shifter can process, in fact, to the blanking period or greater. For such applications where the flying event is benign to the main signal path, the blanking period unnecessarily limits the level shifter to a minimum pulse width that is defined by the time duration of blanking period. On the other hand, for applications that have excessive parasitic elements (as highlighted in FIG. 1A), the flying event can lead to long lasting ringing of the SW node, and the fixed time duration of the blanking period may not be long enough to provide the immunity to the level shifter during the SW node ringing period. Therefore, the fixed blanking (fixed time duration) in known in the art level shifters do not have the flexibility to sense flying events and fast SW node transitions (as would occur during SW node ringing) to provide the immunity required for the level shifter, while at the same time hindering minimum pulse width achievable. By incorporating flying event detector (350) and discriminator (320) of the present teachings, a person skilled in the art will understand that the present invention provides proper immunity during SW node transitions, while allowing very narrow pulse widths to propagate through if the SW node transitions are benign to the main signal path (as detected by the replica signal path) or the SW node transitions settle quickly.

Figure 3C:
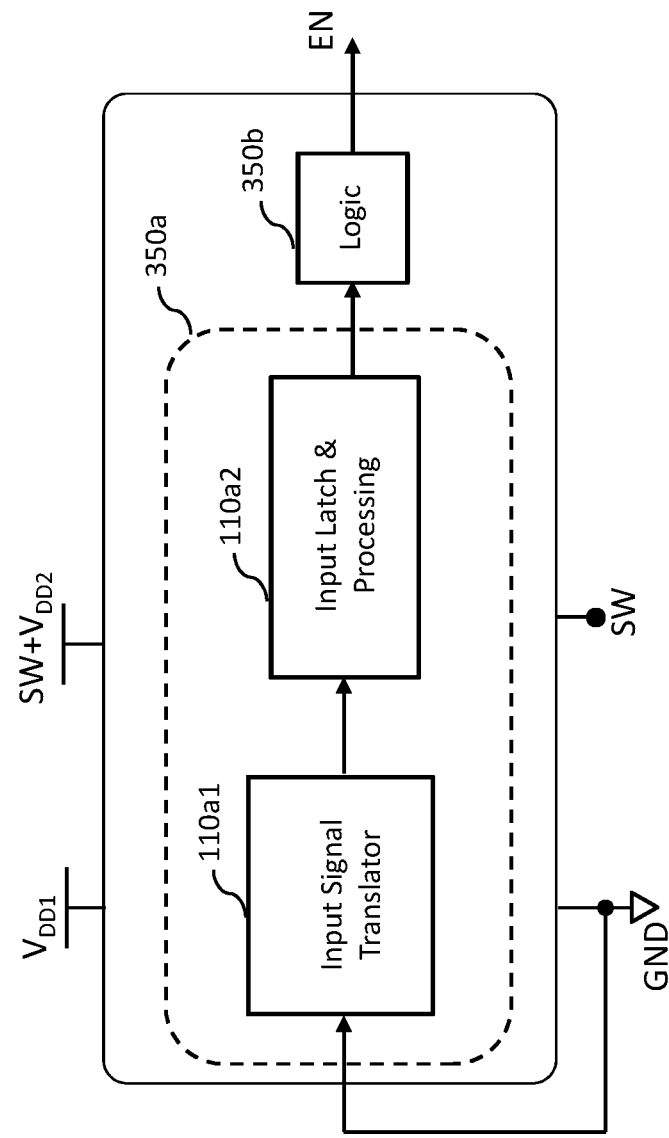
FIG. 3C shows a block diagram of the flying event detector according to the present disclosure, including a replica signal processing path that replicates the main signal processing path.

As shown in FIG. 3C, the flying event detector circuit block (350) of the high side level shifter (310a) as used in the configuration shown in FIG. 3A and FIG. 3B, includes a replica signal processing path (110a1, 110a2) that is a replica of a main signal processing path used in processing the input timing control signal, HX, through the high side level shifter (310a). Accordingly, and as described above, replicated latch nodes, such as $N_{L1\_OUT}$ and $N_{L2\_OUT}$ in the main signal path that is replicated in the replica signal processing path (110a1, 110a2) may react to the switching/flying events common in both replica and main signal processing paths, to generate transient signals corresponding in time and duration to the switching events. Furthermore, as shown in FIG. 3C, the input to the replica circuit (110a1, 110a2) may be, for example, tied to GND (or any other fixed voltage level) so that voltages at the latch nodes of the replica circuit may only reflect charging and discharging of the latch nodes based on the flying events and not further based on changing levels of an input signal being processed (as per the main signal processing path).

With further reference to FIG. 3C, generated transient signals corresponding to charging and/or discharging of the latch nodes responsive to the flying events within the replica signal processing path may be used by a back-end logic circuit block (350b) to generate the enabling signal, EN, that in turn controls blanking of the main signal processing path (e.g., block 320 of FIG. 3A). As described above, the back-end logic circuit block (350b) may equalize time and/or duration of the detected flying events to avoid race conditions between the main signal processing path and the replica signal processing path, thereby allowing proper blanking of transients in the main signal processing path. According to some exemplary embodiments of the present disclosure, such equalization may include, for example, skewing of drive strengths of logic gates, such as for example, inverters, used in the back-end logic block (350b), to reduce propagation delays (e.g., in picosecond range) of edges of interest through such logic gates. This can be done, for example, by different sizing of pull-up and pull-down devices in the logic gates to reduce propagation delays of one edge (e.g., rising edge) with respect to another (e.g., falling edge).

FIG. 4 shows a timing diagram representative of signals through the main processing path of the high side level shifter (310a) of FIG. 3A and FIG. 3B based on an input timing control signal HX (derived from the PWM), having a pulse width of about 2.5 nanoseconds. As can be seen in the timing diagram, of FIG. 4, the high side level shifter (310a) according to the present teachings can generate a high side output timing control signal HS that also has a pulse width of about 2.5 nanoseconds in spite of ringing (overshoot and undershoot) present on the switching reference voltage SW, such ringing generating perturbations at latch nodes $N_{L1\_OUT}$ and $N_{L2\_OUT}$ of the main signal processing path. As previously described, such perturbations (transients) in the main signal processing path may be according to a mechanism exemplified above with reference to FIGS. 2A-2E, and also present in the replica signal processing path.

With continued reference to FIG. 4, perturbations in the main signal processing path can affect an OUT_Logic signal output by the logic circuit block (110a3) of the high side level shifter (e.g., per FIG. 3A). If not blanked, effect of the perturbations on the OUT_Logic signal, as highlighted by details A and B in FIG. 4, can corrupt the high side output control signal HS by introducing undesired transitions (e.g., transitions included in the highlighted details A and B). However, as shown in FIG. 4, this is not the case as: a) the replica signal processing path (110a1, 110a2 of FIG. 3C) of the flying event detector circuit block (350 of FIG. 3C) can reproduce time and duration of the perturbations seen in the main signal processing path to generate therefrom signals SWHI and SWLOW shown in FIG. 4; and b) in turn, the back-end logic circuit (350b of FIG. 3C) can use the SWHI and SWLOW signals to generate the blanking enabling signals BLANKHI and BANKLOW which when provided to the discriminator circuit block (e.g., EN to 320 as shown in FIG. 3A) masks/blanks transitions corresponding to the perturbations, thereby allowing the output latch (110a4 of FIG. 3A) to generate the output HS signal that reproduces the input signal PWM with high accuracy and at substantially shorter pulse widths than the prior art described above. Accordingly, as shown by signal flow details c and d of FIG.

4, correct timing information edges of the OUT_Logic signal are processed by the output latch (110a4 of FIG. 3A) to accurately reproduce the short pulse of the PWM signal.

As used in the present disclosure, a low voltage device or low voltage transistor refers to a semiconductor transistor device with a low breakdown voltage which can withstand and block (e.g. in the OFF state) DC voltages (e.g. typically applied between the source and drain terminals of the transistor, or any two of drain, source and gate terminals) less than 10 volts and more typically substantially less than 10 volts, such as less than 3.3-5 volts. Some exemplary low voltage devices are complementary metal-oxide-semiconductor (CMOS) transistors.

As used in the present disclosure, a high-voltage device or high-voltage transistor refers to a semiconductor transistor device which can withstand and block (e.g. in the OFF state) DC voltages (typically applied between the source and drain terminals of the transistor, or any two of drain, source and gate terminals) greater than 5-10 volts, and more typically substantially greater than 5-10 volts, such as greater than 12-100 volts. Some exemplary high-voltage devices are depletion mode GaN transistors (d-GaN), enhancement mode GaN transistors (e-GaN), stacked MOS transistors, and other high-voltage transistors known to a person skilled in the art, such as bipolar transistors, including those integrated into a CMOS process often called BCD, Si MOSFETs, hexagonal shape FETs (HEXFETs), LDMOS, indium phosphide (InP), etc. which can also be enhancement or depletion modes (e.g. e-type or d-type) and N or P polarity.

Exemplary high-voltage devices that can be used as the high side and low side high-voltage transistors such as T1 and T2 described in the present disclosure may be e-GaN FET, d-GAN FET, SiC FET or high voltage or stacked Si MOSFET transistors. However, such exemplary usage should not be construed as limiting the scope of the invention as disclosed herewith. Unless explicitly mentioned as d-GaN, the terms GaN and e-GaN are considered synonymous herein.

A person skilled in the art can recognize that depletion mode d-GaN devices or other types of high-voltage transistors such as Si MOSFETs, HEXFETs, LDMOS, InP (and all these examples can be of the e-type or d-type; and N or P polarity) or virtually any device capable of switching ON or OFF with high voltages applied can be controlled using a level shifter in accordance with the teachings of the present disclosure. A person skilled in the art would know that specific design considerations in view of a desire to control a specific type of a high-voltage transistor, such as a depletion mode high voltage transistor, may also be needed, description of which is beyond the scope of the present disclosure.

E-GaN devices have typical threshold, or turn-on, voltages of approximately +0.7 to +3 volts of gate-to-source voltage. Such devices are typically capable of withstanding 5 to 200 volts of drain-to-source, $V_{DS}$, voltage, thereby enabling high voltage applications, such as, for example, DC/DC power conversion from a high input voltage to a low output voltage. GaN transistors are used in the present disclosure as an exemplary approach to high voltage power management due to the known advantageous characteristics of GaN transistors, such as, for example, a low $R_{ON}QG$ FOM as known in the art.

Figure 5:
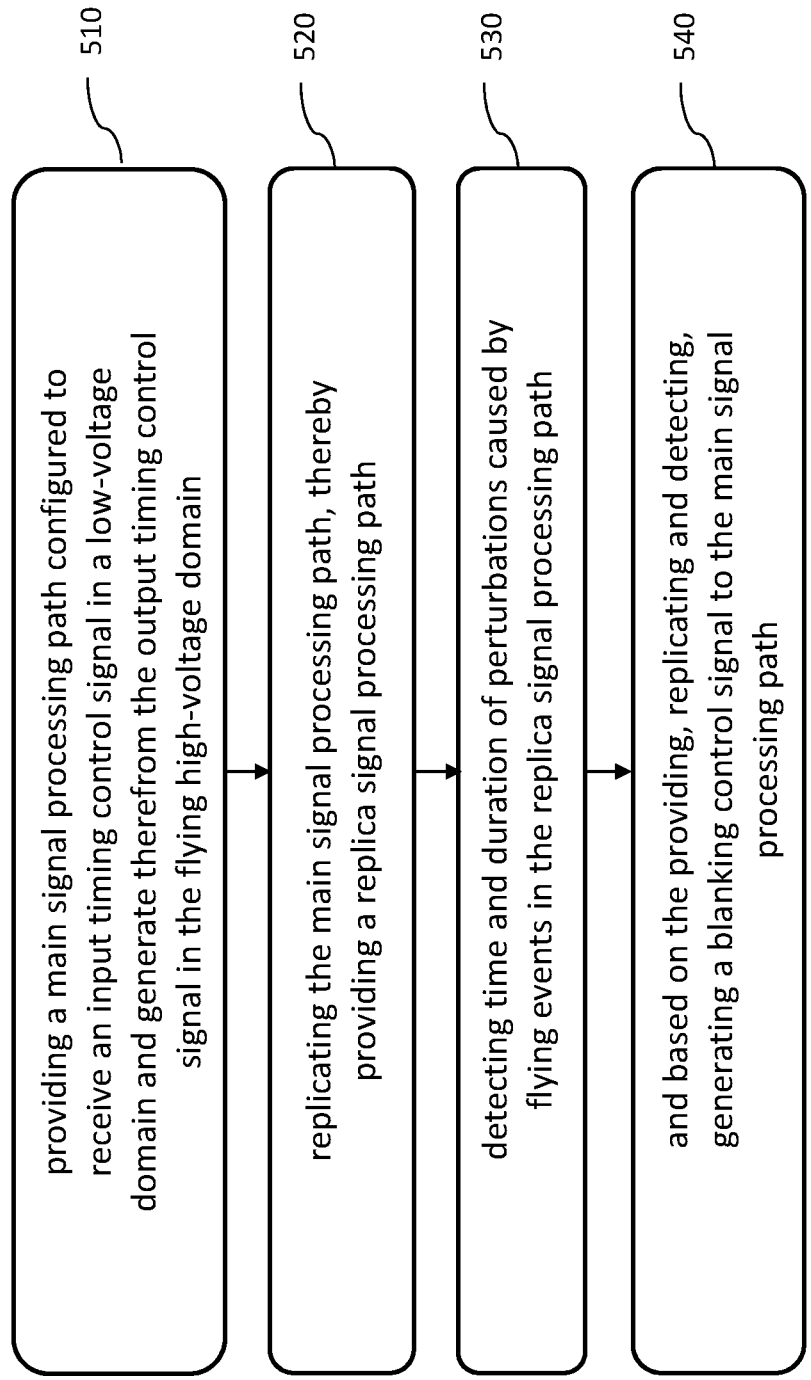
FIG. 5 is a process chart showing various steps of a method for generation of shorter pulse widths of an output timing control signal in a flying high-voltage domain.

FIG. 5 is a process chart (500) showing various steps of a method for generation of shorter pulse widths of an output timing control signal in a flying high-voltage domain, As can be seen in FIG. 5, such steps comprise: providing a main signal processing path configured to receive an input timing control signal in a low-voltage domain and generate therefrom the output timing control signal in the flying high-voltage domain, per step (510); replicating the main signal processing path, thereby providing a replica signal processing path, per step (520); detecting time and duration of perturbations caused by flying events in the replica signal processing path, per step (530); and based on the providing, replicating and detecting, generating a blanking control signal to the main signal processing path, per step (540).

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, bipolar, bipolar-CMOS-DMOS (BCD), silicon-on-insulator (SOI), silicon-on-sapphire (SOS), GaN HEMT, GaAs pHEMT, and MESFET technologies. However, the inventive and exemplary concepts described above are particularly useful with a BCD process with high voltage transistors available, but also well-suited to an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. It is specifically noted that voltages up to hundreds, and even thousands, of volts may be controlled with the current invention, as long as the required high voltage transistors are available for the chosen voltage. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the current invention and are not intended to limit the scope of what the applicant considers to be the invention. Such embodiments may be, for example, used in various power conversion applications (DC-to-DC, AC-to-DC, DC-to-AC, etc); various level translation applications; and general driver applications for isolated and non-isolated systems. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuit for generation of an output timing control signal in a flying high-voltage domain, the circuit comprising:
a main signal processing path configured to receive an input timing control signal in a low-voltage domain and generate therefrom the output timing control signal in the flying high-voltage domain; and
a flying event detector circuit comprising a replica signal processing path that is a replica of the main signal processing path, the flying event detector circuit configured to detect time and duration of perturbations caused by flying events in the replica signal processing path and generate therefrom a blanking control signal to the main signal processing path.

2. The circuit of claim 1, wherein the main signal processing path comprises a discriminator circuit block that is configured to insert a blanking period in the main signal processing path based on the time and duration of the perturbations.

3. The circuit of claim 2, wherein the main signal processing path is configured to not process any timing information during the blanking period.

4. The circuit of claim 3, wherein the flying event detector circuit further comprises a back-end logic circuit block that is configured to adjust the blanking control signal to avoid race conditions between processing of perturbations due to flying events in the main signal processing path and in the replica signal processing path.

5. The circuit of claim 1, wherein an input to the replica signal processing path is a signal having a fixed voltage level.

6. The circuit of claim 5, wherein the fixed voltage level is at a ground reference level of the low-voltage domain.

7. The circuit of claim 1, wherein the replica signal processing path replicates latch nodes of the main signal processing path, the latch nodes reacting to the flying event to generate the perturbations.

8. The circuit of claim 1, wherein
the main signal processing path comprises circuit blocks operating over the low-voltage domain and circuit blocks operating over the flying high-voltage domain, and
the replica signal processing path replicates the circuit blocks operating over the low-voltage domain and circuit blocks of the circuit blocks operating over the flying high-voltage domain that include latch nodes.

9. The circuit of claim 8, wherein the circuit blocks operating over the flying high-voltage domain that include the latch nodes comprise:
an input signal translator circuit block that is configured to translate timing information contained in the input timing control signal to a level shifted signal, and
an input latch and processing circuit block that comprises at least one latch configured to latch the level shifted signal.

10. The circuit of claim 1, wherein
the low-voltage domain operates between a reference ground and a first low voltage, and
the flying high-voltage domain operates between a switching reference voltage that switches between a high voltage and the reference ground, and a second low voltage that rides the switching reference voltage.

11. The circuit of claim 10, wherein the high voltage is equal to or higher than 10 volts, the first low voltage is equal to or lower than 5 volts, and the second low voltage is equal to, or lower than, 5 volts.

12. The circuit of claim 11, wherein the first low voltage is equal to the second low voltage.

13. The circuit of claim 1, wherein the input and the output timing control signals include a pulse signal having a duration that is shorter than 10 nanoseconds.

14. The circuit of claim 1, wherein the input and the output timing control signals include a pulse signal having a duration that is shorter than 5 nanoseconds.

15. The circuit of claim 1, wherein the output timing control signal is configured to control ON and OFF states of a high-voltage device to generate a switching of a reference voltage of the flying high-voltage domain to a high voltage level for the duration of the pulse signal.

16. A high-side level shifter comprising the circuit of claim 15.

17. The circuit of claim 1, wherein the circuit is monolithically integrated.

18. A high-voltage switching device, comprising:
- a first high-voltage device and a second high-voltage device in series connection through a common node;
- a high-side level shifter comprising the circuit according to claim 1, the high-side level shifter configured to control ON and OFF states of the first high-voltage device; and
- a low-side level shifter, the low-side level shifter configured to control ON and OFF states of the second high-voltage device, wherein
- the ON and OFF states of the first and second high-voltage devices generate, at the common node, a switching reference voltage of the flying high-voltage domain that switches between a high voltage at a drain of the first high-voltage device and a reference ground at the source of the second high-voltage device, and
- the switching reference voltage includes pulses at the high voltage with a duration that is shorter than 10 nanoseconds.

19. The high-voltage switching device of claim 18, wherein said pulses have a duration that is shorter than 5 nanoseconds.

20. A method for generation of shorter pulse widths of an output timing control signal in a flying high-voltage domain, the method comprising:
- providing a main signal processing path configured to receive an input timing control signal in a low-voltage domain and generate therefrom the output timing control signal in the flying high-voltage domain;
- replicating the main signal processing path, thereby providing a replica signal processing path,
- detecting time and duration of perturbations caused by flying events in the replica signal processing path; and
- based on the providing, replicating and detecting, generating a blanking control signal to the main signal processing path.

* * * * *